United States Patent [19]

Chen et al.

[11] Patent Number: 5,206,524
[45] Date of Patent: Apr. 27, 1993

[54] HETEROSTRUCTURE BIPOLAR TRANSISTOR

[75] Inventors: Young-Kai Chen, Berkeley Heights; Anthony F. J. Levi, Summit, both of N.J.; Richard N. Nottenburg, New York, N.Y.; Morton Panish, Springfield, N.J.

[73] Assignee: AT&T Bell Laboratories, Murray Hill, N.J.

[21] Appl. No.: 721,913

[22] Filed: Jun. 20, 1991

Related U.S. Application Data

[63] Continuation of Ser. No. 511,872, Apr. 19, 1990, abandoned, which is a continuation of Ser. No. 250,790, Sep. 28, 1988, abandoned.

[51] Int. Cl.$^5$ .......................................... H01L 29/72
[52] U.S. Cl. ................................ 257/29; 257/198; 257/592
[58] Field of Search ............ 357/34 HB, 16, 61, 30 E

[56] References Cited

U.S. PATENT DOCUMENTS

| | | | |
|---|---|---|---|
| 4,617,724 | 10/1986 | Yokoyama et al. | 357/34 |
| 4,672,404 | 6/1987 | Ankri et al. | 357/34 |
| 4,710,936 | 12/1987 | Shibata et al. | 357/16 |
| 4,758,870 | 7/1988 | Hase et al. | 357/34 |
| 4,768,074 | 8/1988 | Yoshida et al. | 357/34 |
| 4,825,265 | 4/1989 | Lunardi et al. | 357/34 |
| 4,827,320 | 5/1989 | Morkoc et al. | 357/55 |
| 4,829,343 | 5/1989 | Levi | 357/61 |
| 4,829,347 | 5/1989 | Cheng et al. | 357/16 |
| 4,833,511 | 5/1989 | Sugimoto | 357/30 E |
| 4,926,232 | 5/1990 | Ando et al. | 357/34 |
| 5,031,005 | 7/1991 | Futatsugi et al. | 357/16 |

FOREIGN PATENT DOCUMENTS

| | | | |
|---|---|---|---|
| 129477 | 12/1984 | European Pat. Off. | |
| 60-010774 | 1/1985 | Japan | 357/16 |
| 60-010775 | 1/1985 | Japan | 357/16 |
| 61-04279 | 1/1986 | Japan | 357/34 HB |
| 61-226961 | 10/1986 | Japan | 357/34 HB |
| 62-229878 | 10/1987 | Japan | 357/34 HB |
| 63-006878 | 1/1988 | Japan | 357/16 |
| 63-156356 | 6/1988 | Japan | 357/34 HB |
| 2128026 | 4/1984 | United Kingdom | 357/34 HB |

OTHER PUBLICATIONS

Das, M. "High-Frequency Performance Limitations . . . " IEEE Trans. Elec. Dev. May 1988, pp. 604–614.
Kroemer, "HBTs & ICs," Proc. of the IEEE, vol. 70, No. 1, pp. 13–25, Jan. 1982.

(List continued on next page.)

*Primary Examiner*—Andrew J. James
*Assistant Examiner*—Sara W. Crane
*Attorney, Agent, or Firm*—E. E. Pacher

[57] ABSTRACT

Improved heterojunction bipolar transistor (HBT) are disclosed. Inventive devices can attain high cut-off frequency ($f_T$), exemplarily 80 GHz or higher, and high DC current gain ($\beta$), exemplarily 25 or higher. The devices exhibit lateral scaling, permitting reduction in emitter stripe width without unacceptable decrease in $\beta$. Exemplarily the stripe width is 1 $\mu$m or less. The inventive HBTs are hot electron devices, with the hot electrons in the base region being spatially confined such that relatively few electrons reach the surface of the extrinsic base region. The relatively low bulk and surface recombination rate in the base of inventive HBTs is an important aspect of the invention and makes possible devices having relatively high $\beta$ and low power consumption. Appropriate choice of base material, namely, a semiconductor material having relatively low intrinsic surface recombination velocity, can result in further reduction of surface recombination, as can, for instance, the use of an appropriate non-alloyed metal base contact. Appropriate choice of collector material can result in improved ballistic transport through the collector depletion region, and novel selection criteria are disclosed. InP, InAs, and $In_{0.53}Ga_{0.47}As$ are exemplary materials that meet these criteria. Use of a highly doped collector contact region, with dopant level within a relatively narrow concentration range, can also lead to improved device behavior, as can the use of a compound emitter that comprises one or more appropriately placed thin undoped heteroepitaxial layers.

8 Claims, 5 Drawing Sheets

OTHER PUBLICATIONS

Sugiura et al., "High-Current-Gain In GaAs/InP Double HBT Grown by Metal Organic Vapor Phase Epitaxy," IEEE Elec. Dev. Let., vol. 9, No. 5, pp. 253–255, May 1988.

Ishibashi et al., "A Novel AlGaAs/GaAs HBT Structure for Near Ballistic Collection," IEEE Trans. on. Elec. Dev., vol: ED-34, pp. 237, Nov. 1987.

Malik et al., "High Gain $Al_{0.48}In_{0.52}As/Ga_{0.53}As$ Vertical n-p-n HBTs Grown by MBE," IEEE Elec. Dev. Let., vol. EDL-4, No. 10, pp. 383–385, Oct. 1983.

Fukano et al., "High-Speed InA/As HBTs," IEEE Elec. Dev. Let., vol. 9, No. 6, pp. 312–315, Jun. 1988.

Nagata et al., "Self-Aligned AlGaAs/GaAs HBT w/Low Emitter Resistance . . . ", IEEE Trans. on Elec. Dev., vol. ED-35, No. 1, pp. 2–7 Jan. 1988.

Asbeck et al., "Numerical Simulation of GaAs/GaAlAs . . . ", IEEE Elec. Dev. Let., vol. EDL-3, No. 12, pp. 403–406, Dec. 1982.

Asbeck et al., "HBTs for Microwave & Millimeter-Wave I.C.," IEEE Trans. on Elec. Dev., vol. ED-34, No. 12, pp. 2571–2579, Dec. 1987.

Chang et al., "AlGaAs/GaAs HBTs Fabricated Using a Self-Align Dual-Lift-Off Process," IEEE Elec. Dev. Let., vol. EDL-8, No. 7, pp. 303–305, Jul. 1987.

Tully, "HBTs with Ion Implanted Bases," IEEE Elec. Dev. Let, vol. EDL-7, No. 4, pp. 203–205, Apr. 1986.

Asbeck et al., "GaAs/GaAlAs HBTs w/Cutoff Freq. Above 10 GHz," IEEE Elec. Dev. Let., vol. EDL-3, No. 12, Dec. 1982.

Ishibashi, "A Possible Near-Ballistic Collection in an AlGaAs/GaAs HBT w/A Modified Collector Structure," IEEE Tras. Elec. Dev., vol. 35, No. 4, pp. 401–404, Apr. 1988.

Nagata et al., "High-Speed Performance of AlGaAs/GaAs HBTs w/Nonalloy Emitter Contacts", IEEE Trans. Elec. Dev., vol. ED-34, p. 2369, Nov. 1987.

Chen, Reddy, Moi, Peng, Morkoc; Enhanced Ballistic Transport. in InGaAs/InAlAs hot-electron transistor, Jul. 23, 1987, pp. 1254–1255.

Hayes et al, Hot electron transport in a graded band-gap base heterojunction bipolar transistor, Apr. 18, 1988, pp. 490–492 Appl. Phys. Lett.

Ramberg et al, Lattice-strained heterojunction InGaAs/GaAs bipolar structures:Recombination properties and Device performance, pp. 1234–1236 J. Appl. Phys.

Kuzuhara, Transient Simul. of AlGaAs/GaAs/AlGaAs and AlGaAs/InGaAs/AlGaAs HETs., Jan. 1, 1989, IEEE Transactions on Electron Devices.

"Scaling 'Ballistic' Heterojunction Bipolar Transistors", by A. F. J. Levi, *Electronics Letters*, vol. 24, No. 20, Sep. 29, 1988, pp. 1273–1275.

"Submicron Scaling of AlGaAs/GaAs Self-Aligned Thin Emitter Heterojunction Bipolar Transistors (SATE-HBT) With Current Gain Independent of Emitter Area", by R. J. Malik, *Electronics Letters*, Aug. 17, 1989, vol. 25, No. 17, pp. 1175–1177.

"High Gain InGaAs/InP Heterostructure Bipolar Transistors Grown by Gas Source Molecular Beam Epitaxy", by R. N. Nottenburg, *Applied Physics Letters*, 49(17), Oct. 27, 1986, pp. 1112–1114.

"InGaAs/InAlGaAs Hot-Electron Transistors With Current Gain of 15", by K. Imamura et al., *Electronics Letters*, vol. 22, No. 21, Oct. 1986, pp. 1143–1150.

*IEEE Spectrum*, Feb. 1986, "The Quest for Ballistic Action" by T. E. Bell, pp. 36–38.

*IEEE Spectrum*, Feb. 1986, "Ballistic Electrons in Compound Semiconductor" by L. F. Eastman, pp. 42–45.

*IEEE Electron Device Letters*, vol. EDL-8, No. 5, May 1987, "Submicrometer Fully Self-Aligned AlGaAs/GaAs Heterojunction Bipolar Transistor" by N. Hayama et al, pp. 246–248.

*IEEE Transactions on Electronic Devices*, vol. ED-33, No. 4, Apr. 1986, "A 30-ps Si Bipolar Ic Using Super Self-Aligned Process Technology", by S. Konaka et al, pp. 526–531.

HETEROSTRUCTURE BIPOLAR TRANSISTOR

This application is a continuation of application Ser. No.07/511,872, filed on Apr. 19, 1990, now abandoned which is a continuation of application Ser. No. 07/250,790, filed on Sep. 28, 1988, now abandoned.

FIELD OF THE INVENTION

This application pertains to the field of active semiconductor devices. In particular, it pertains to heterostructure bipolar transistors in which at least some of the current is carried by hot electrons.

BACKGROUND OF THE INVENTION

It has been known for some time that a hot electron transistor could potentially be operated at frequencies in excess of those achievable with conventional (diffusive) transistors. See, for instance, T. E. Bell, *IEEE Spectrum*, February 1986, pp. 36–38, incorporated herein by reference. Various types of hot electron transistors (HET) have been proposed. This application is concerned with one particular class of such transistors, namely, hot electron heterojunction bipolar transistors (HBTs). For a brief review, see L. F. Eastman, ibid, pp. 42–45, also incorporated herein by reference.

The flow of electrons from emitter to collector in a bipolar transistor is controlled by varying the emitter/base barrier potential by means of an applied voltage $V_{eb}$, and is also a function of an externally applied voltage $V_{bc}$ between base and collector. Under normal operating conditions, $V_{bc}$ reverse biases the base/collector junction. Electrons injected from the emitter into the base of a bipolar HET have energy substantially greater than the thermal energy of the ambient electrons in the base. These "hot" electrons ideally should traverse the base and collector depletion region without undergoing significant scattering, and enter the sea of conduction electrons in the collector contact region.

As will be readily understood by those skilled in the art, substantial difficulties have to be overcome before a device of this type can function as a practical HET. Among these is the difficulty of achieving substantial hot electron transport through the base and the depletion region of the collector.

Three recently filed U.S. patent applications Ser. No. 871,494, filed Jun. 6, 1986 by J. R. Hayes et al; Ser. No. 074,127, filed Jul. 17, 1987, by A. F. J. Levi; and Ser. No. 241,279, filed Sep. 7, 1988 by A. F. J. Levi, all incorporated herein by reference), disclose means for achieving improved HETs. However, in view of the general desirability of improved characteristics such as larger DC current gain $\beta$ (defined as collector current $I_c$ divided by base current $I_b$) and high cut-off frequency $f_T$, means for achieving further improvements in HET characteristics would be of considerable significance.

In prior art HBTs the emitter stripe width is relatively large, typically at least about 1 $\mu$m and, to the best of our knowledge, has not been less than 0.6 $\mu$m even in a laboratory device that had quite low $\beta$ (from the data reported it can be deduced to have been about 16; see N. Hayama et al, *IEEE Electron Device Letters*, Vol. EDL-8(5), May 1987, pp. 246–248). To the best of our knowledge, the prior art has not succeeded in making a HBT which combines at room temperature a large $f_T(\gtrsim 80$ GHz) with a large ($\gtrsim 25$) $\beta$ and small ($\gtrsim 1$ $\mu$m) emitter stripe width. This is to be contrasted with Si bipolar transistors in which high performance and stripe widths as small as 0.35 $\mu$m have been achieved (see S. Honaka et al, *IEEE Transactions on Electronic Devices*, Vol. ED-33, pp. 526–531, 1986). As is well known to those skilled in the art, narrow emitter stripe width is advantageous since it can, inter alia, result in lower power consumption at a constant current density (and thus make possible larger scale integration), or in increased speed at a constant current (and thus constant power).

In a prior art (diffusive) bipolar transistor electrons are injected from the emitter stripe into the base, with the base typically being substantially wider than the emitter stripe (a bipolar transistor structure is schematically depicted in FIG. 1). The base region that underlies the emitter stripe is frequently referred to as the "intrinsic" base region, and the base regions that do not underlie the emitter stripe as the "extrinsic" base regions. It is to be noted that in this context "intrinsic" has nothing to do with the dopant concentration in the base region.

Electrons injected into the intrinsic base region of a (diffusive) bipolar transistor undergo diffusive motion, and some of these minority carriers undergo recombination, a process which, inter alia, results in decreased $\beta$. Recombination can take place both in the bulk base region and on the exposed surfaces of the (extrinsic) base region. Associated with any semiconductor material is an intrinsic surface recombination velocity $S_o$. For instance, in silicon $S_o$ is approximately 10 cm/sec, whereas in GaAs it is about $10^6$ cm/sec.

As will be readily appreciated by those skilled in the art, surface recombination in general becomes of increasing importance as the emitter stripe width is decreased. Due to the relatively small $S_o$ of Si it is possible to make transistors that have small stripe width and yet have acceptable values of $\beta$. However, due at least in part to the much larger $S_o$ of GaAs it has not been possible to similarly reduce the stripe width of GaAs HBTs without causing unacceptable degradation of $\beta$. As is well known, most of the work on HBTs has so far been done on GaAs-based devices. From the above discussion it can be seen that the relatively large stripe width of prior art HBTs generally is a deliberate design choice and is not due to any processing limitation.

DEFINITIONS

Electron transport in a crystal is herein defined to be "ballistic" if, in addition to its possible interaction with an accelerating electric field, the electron interacts substantially only with the static part of the periodic lattice potential. Electron transport thus may be ballistic even through the electrons undergo some small angle scattering and/or small energy change.

A conduction electron herein is considered to be a "hot" electron in a given semiconductor region if its energy E is substantially greater than the ambient thermal energy $k_BT$. Typically, $E \gtrsim 8k_BT$, where $k_B$ is the Boltzmann constant, and T is the absolute temperature of the lattice.

A "hot electron" transistor (HET) is a transistor whose operative characteristics are in substantial part determined by the transport of hot electrons through the transit region of the transistor, with minimal scattering of the hot electrons in the transit region.

The "transit region" of a HET herein is that portion of the HET through which substantial hot electron transport takes place, or is intended to take place. For instance, in a bipolar transistor, the transit region consists of the base and the collector depletion region. In order to have the possibility of significant hot electron transport in a HET, the width of the transit region has to be less than the mean-free path of the hot electrons in the material.

The "ambient" charge carriers are those charge carriers (electrons or holes) that are essentially in thermal equilibrium with the lattice. For instance, in n-p-n HBTs the ambient charge carriers in the base are holes.

SUMMARY OF THE INVENTION

Broadly speaking this application discloses HBTs having improved device characteristics, exemplarily high current gain, high cut-off frequency, and/or low power dissipation. Transistors according to the invention typically will have device geometries that are similar to those of prior art HBTs (preferably including the relatively thin transit region disclosed in the above referred to '279 U.S. patent application), but will typically have substantially reduced emitter stripe width and/or comprise collector material that meets certain novel criteria. Other optional design features, to be discussed below, may also be present.

HBTs according to the invention comprise, in addition to the emitter region, a collector region and a base region intermediate and in contact with the emitter and collector regions, and further comprise means for making electrical contact with the emitter region, the base region, and the collector region. The inventive transistors are hot electron transistors, that is, they are of a type wherein, under normal operating conditions, hot electrons are caused to be injected from the emitter into the base region. In at least some preferred embodiments the collector comprises a semiconductor material wherein $E_{bw} - E_g$ is greater than about 0.6 eV, where $E_{bw}$ and $E_g$ are the conduction band width and bandgap energy of the semiconductor material. In some preferred embodiments the semiconductor material is furthermore selected to have $\Delta_{\Gamma-x} = E_{\Gamma-x} - E_g \geq 0$, where $E_{\Gamma-x}$ is the separation in energy between the $\Gamma$-minimum and the X-minimum in the conduction band of the material. Exemplarily, $In_{0.53}Ga_{0.47}As$, InAs and InP have $\Delta_{\Gamma-x}$ of about 0.4 eV, 1.45 eV, and 0.45, respectively.

In at least some devices the collector material also meets the criterion that $\Delta_{\Gamma-L} = E_{\Gamma-L} - E_g \geq -0.2$ eV, where $E_{\Gamma-L}$ is the separation in energy between the $\Gamma$-minimum and the L-minimum in the conduction band. Exemplarily, $In_{0.53}Ga_{0.47}As$, InAs, and InP have $\Delta_{\Gamma-L}$ of about $-0.2$ eV, 0.55 eV, and $-0.2$ eV, respectively.

Use of semiconductor material that meets the first (preferably both) of the above criteria can result in a HBT in which a substantial fraction of the electron transport in the collector depletion region is ballistic. It can also result in a device whose cut-off frequency is substantially independent of $V_{bc}$ over a voltage range that is compatible with current semiconductor technology. Exemplarily, for $In_{0.53}Ga_{0.47}As$ this range of $V_{bc}$ is between about 0 and about 0.4 volts, a convenient range for switching and other technologically significant applications.

In at least some preferred embodiments of the invention under normal operating conditions at least a significant fraction of the hot electrons injected into the base can traverse the base region without undergoing substantial scattering therein, the device has operating characteristics unattained by prior art HBTs (typically $f_T \geq 80$ GHz and $\beta \gtrsim 25$, both at room temperature), and the emitter stripe has a width that is equal to or less than about 1 $\mu$m. Differently stated, inventive HBTs can have an emitter stripe width W that is less than that of a diffusive HBT having the same $\beta$ and $f_T$. If $f_T$ of the inventive HBT is too large to be matched by any diffusive HBT then the diffusive comparison HBT is to have a $f_T$ of at least 80 GHz.

The hot electrons injected into the base of an inventive transistor do not diffuse in the base but traverse the base more or less ballistically, spatially confined, in the form of a more or less well defined (diverging) beam of hot electrons. This mode of electron transport results in reduced likelihood of surface recombination, as manifested by substantial lateral scaling of inventive transistors. This makes possible a substantial reduction of the emitter stripe width without incurring the substantial decrease of $\beta$ associated with prior art GaAs HBTs. In particularly preferred embodiments, the base region comprises a semiconductor material whose surface recombination velocity is substantially less than about $10^5$ cm/sec, whereby surface recombination is still further reduced. Exemplarily, $In_{0.53}Ga_{0.47}As$ is such a material.

HBTs with narrow emitter stripe according to the invention can have relatively low power dissipation for a given operating current density and thus are more suitable for large scale integration than prior art GaAs-based HBTs. Furthermore, due to low surface recombination, transistors according to the invention can have higher $f_T$ than is obtainable in comparable prior art devices. Inventive transistors can find application in, for example, high speed, low power, digital and analog integrated circuits for high speed computers and fiber optic communication systems. Due to the improved lateral device scaling inventive HBTs can also advantageously be used in relatively high (>10 GHz) and moderate (<10 GHz) speed applications where small emitter stripe widths are required. Significantly, at least in some embodiments the inventive HBTs are well adapted to integration with optical and/or opto-electronic devices, especially such devices that are designed to operate at relatively long wavelengths, e.g., in the range 1.3—1.6 $\mu$m. This wavelength regime is currently preferred for fiber optical communications. Thus we contemplate apparatus and systems comprising one or more HBTs according to the invention and one or more optical or optoelectronic devices whose operating wavelength lies in the infrared part of the electromagnetic spectrum functionally integrated on or in a common semiconductor substrate, exemplarily an InP wafer or chip.

The figures are not necessarily drawn to scale, nor are the relative proportions intended to be accurate.

DETAILED DESCRIPTION OF SOME PREFERRED EMBODIMENTS

Figure 1:
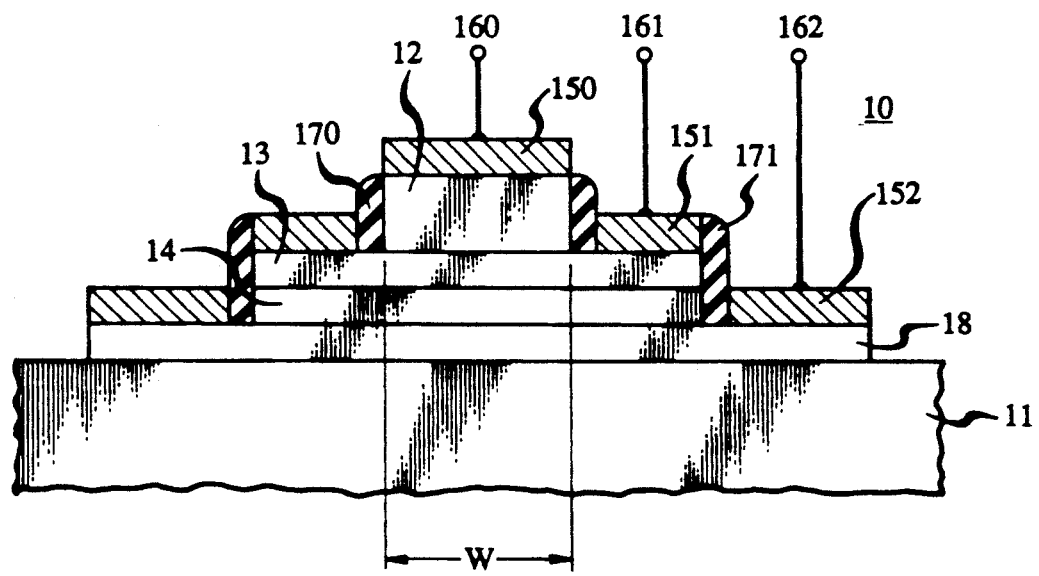
FIG. 1 schematically depicts a device according to the invention.

FIG. 1 schematically depicts an exemplary HBT according to the invention. The transistor 10 comprises substrate 11, with collector contact region 18, collector depletion region 14, base region 13, and emitter region 12 being epitaxial with the respective adjacent regions and/or substrate. Typically the substrate is semi-insulating semiconductor material, collector and base region can (but need not) comprise the same semiconductor material as the substrate, and the emitter comprises semiconductor material that differs from that of the base. FIG. 1 also shows contact means 150, 151, and 152, and insulators 170 and 171 placed to prevent shorting. Indicated are also means 160, 161, and 162 for making electrical contact with the emitter, base, and collector regions, respectively. In many embodiments inventive HBTs have an elongate emitter region (the emitter "stripe") of width W. As will be appreciated by those skilled in the art, FIG. 1 is exemplary only and, for instance, HBTs having an inverted structure are also possible.

Those skilled in the art are familiar with techniques and processes that can be used to produce HBTs of the type relevant to this application. These processes comprise epitaxial growth processes such as molecular beam epitaxy or metal-organic chemical vapor deposition, ion implantation, rapid thermal annealing, lithography, and wet or dry etching.

Figure 2:
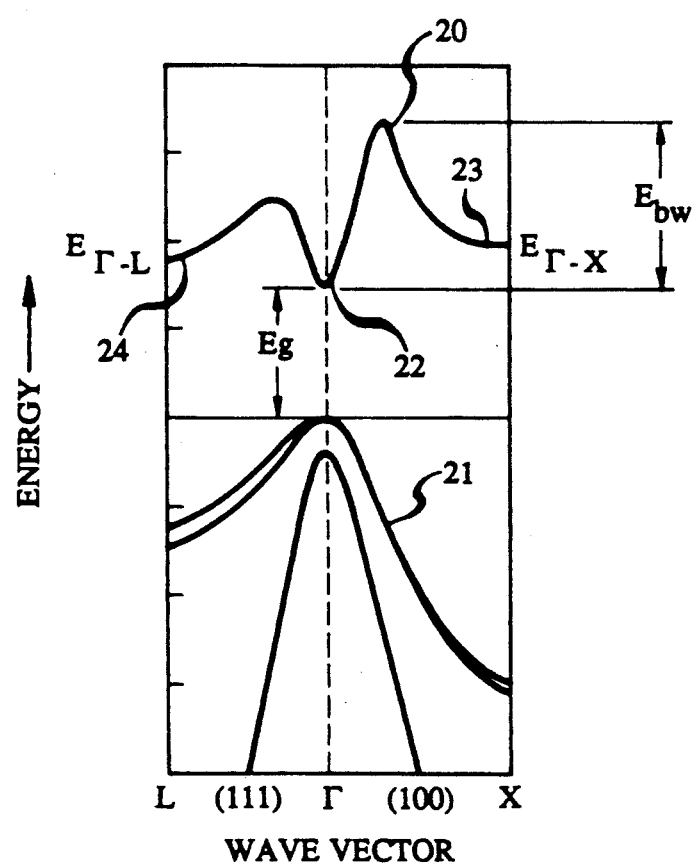
FIG. 2 schematically illustrates some features of the band structure of a semiconductor material.

FIG. 2 shows relevant portions of the energy band structure of an exemplary semiconductor. Such diagrams are well understood by those skilled in the art and do not require detailed explanation. In particular, FIG. 2 shows the conduction band edge 20 and the valence band edge 21, with the former comprising the $\Gamma$-minimum 22, the X-minimum 23 and the L-minimum 24. The figure also shows the significance of the bandgap energy $E_g$ and of the energy differences $E_{\Gamma-X}$ and $E_{\Gamma-L}$. Many of the semiconductors of interest herein have an energy band structure qualitatively similar to that shown in FIG. 2. The band structures of semiconductors of current technological interest are well known; however, if the band structure for a semiconductor is not currently known then it can be readily calculated by known techniques, e.g., the pseudopotential method.

The art has long sought to find ways of minimizing the scattering of the hot electrons in the transit region of a HET. In the above referred to '279 U.S. patent application, it was, inter alia, disclosed that such scattering can be decreased if the transit region comprises (typically, the base region and collector region consist of) semiconductor material having $$E_{bw} - E_g \gtrsim 0.6 \text{ eV}.$$

Figure 3:
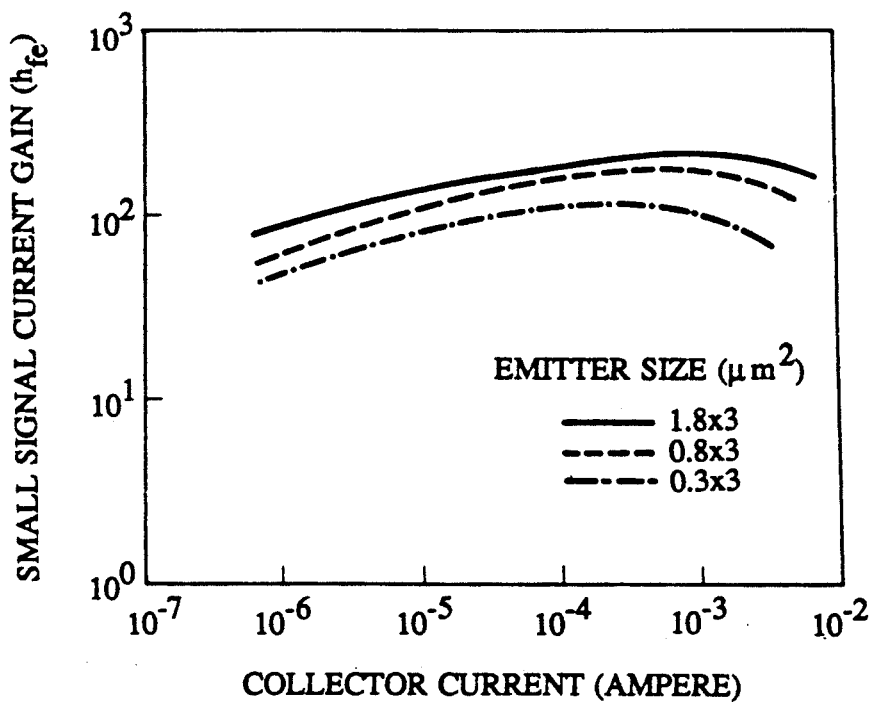
FIG. 3 shows exemplary curves of small signal current gain vs. collector current for transistors having different emitter stripe width.

Furthermore, FIG. 3 of the '279 application shows that in p-GaAs the inelastic scattering rate of hot electrons decreases with increasing dopant concentration above a dopant concentration that is a function of the average energy $E_i$ of the hot electrons. For instance, it is shown there that for $E_i = 200$ meV the inelastic scattering rate decreases with increasing dopant concentration above about $2 \times 10^{19}$ cm$^{-3}$. It is also disclosed in the '279 application that similar results apply to other compound semiconductor materials useful for hot electron bipolar transistors. As is shown in more detail below, an acceptable value for $E_i$ in an exemplary hot electron transistor according to the invention is about 200 meV. Thus, exemplary incentive transistors typically will have base doping levels of at least about $2 \times 10^{19}$ cm$^{-3}$.

We have discovered further requirements which can lead to further reduction of scattering of the hot electrons in the collector depletion region of HBTs according to the invention. One of these requirements is $\Delta_{\Gamma-X} = E_{\Gamma-X} - E_g \geq 0$. In devices that do not meet this condition output impedance will typically be low and the number of ballistic electrons that can transit the collector depletion region will also be relatively low. Exemplary semiconductors that meet this requirement are $In_{0.53}Ga_{0.47}As$ ($\Delta_{\Gamma-X} = 0.4$ eV), InAs (1.45 eV), and InP (0.45 eV). Use of a semiconductor material that meets the above requirement to form the collector region can lead to a substantial improvement in the ballistic transport in the collector depletion region (which in turn can result in improved $\beta$) for reasonable values of $V_{bc}$, and at least some currently preferred transistors according to the invention comprise a collector region and base region made from semiconductor material that meets the above requirement.

The above requirement insures that in the collector depletion region the rate of scattering from the $\Gamma$-valley into the X-valley can be small for reasonable values of $V_{bc}$. Since $\Gamma \to X$ scattering is potentially a very important scattering mechanism its absence or decreased likelihood can lead to substantial improvement in the current gain. A further scattering mechanism which typically is also of some (although typically lesser) importance is $\Gamma \to L$ scattering. By choosing a collector material having $\Delta_{\Gamma-L} = E_{\Gamma-L} - E_g \geq -0.2$ eV $\Gamma \to L$ scattering can be substantially reduced. Failure to meet this criterion has similar (but typically less severe) consequences than failure to meet the $\Delta_{\Gamma-X}$ criterion. Exemplary semiconductor materials that meet this criterion are $In_{0.53}Ga_{0.47}As$ ($\Delta_{\Gamma-L} = -0.2$ eV), InAs (0.55 eV), and InP ($-0.2$ eV).

The above criteria (preferably together with the previously disclosed criterion $E_{bw} - E_g \gtrsim 0.6$ eV) defines a class of semiconductor materials which can be advantageously used as collector material in hot electron HBTs since the choice can result in devices in which a substantial fraction of the electron transport in the collector depletion region is ballistic. This choice of collector material can furthermore result in a transistor whose cut-off frequency is substantially independent of $V_{bc}$ over a significant (and technologically useful) voltage range, a characteristic typically not found in prior art HBTs. Exemplarily, for $In_{0.53}Ga_{0.47}As$ this range of $V_{bc}$ is from about 0 to about 0.4 V.

We have also discovered that it is possible to substantially reduce the emitter size of an appropriately designed HBT without incurring an unacceptably large decrease in $\beta$. At least some preferred HBTs according to the invention thus have an emitter size that is comparable to emitter size in analogous state of the art Si devices and that is substantially smaller than that currently used in high speed GaAs-based HBTs. In particular, these preferred devices typically have an emitter stripe width W (see FIG. 1) of less than about 1 $\mu$m, preferably no more than about 0.5 $\mu$m, while having $\beta \gtrsim 25$.

The above referred to reduction in W without attendant unacceptable decrease in $\beta$ is possible if the electrons injected into the base from the emitter are hot electrons (typically $E_i \gtrsim 0.2$ eV, where $E_i$ is the average energy of the injected hot electrons), and such that at least a substantial portion of the injected hot electrons are spatially confined in the base. A necessary condition for this to occur is that there is a substantial likelihood that an electron can traverse the base region without undergoing substantial scattering therein. Some techniques that can result in low scattering in the bulk of the base region are disclosed in the '279 U.S. patent application.

Hot electrons injected into the base region over an abrupt heterojunction have a high velocity (exemplarily about $10^8$ cm/sec) compared to that of the electrons in "diffusive" transistors (about $10^7$ cm/sec). Furthermore, the hot electrons are injected into the base in beam-like manner, with the average angle of divergence of the "beam" $<\theta>$ being about $\tan^{-1} (k_B T/E_i)^{0.5}$. Typically in inventive HBTs $<\theta>$ is less than about 20°.

Due to the high velocity, beam-like injection with relatively low $<\theta>$ and substantially ballistic transport through the base the rate of non-radiative recombination in the bulk of the base and on the extrinsic base region surfaces of at least some inventive HBTs can be substantially lower than in diffusive devices, making possible significantly larger $\beta$ in such ballistic HBTs, as compared to diffusive HBTs. In ballistic HBTs an increase in $\beta$ can also result from a reduction in $Z_b$, the thickness of the base layer, and $Z_b \lesssim 100$ nm is preferred.

Furthermore, appropriate choice of base material can result in a substantial further reduction of surface recombination. Advantageously the base material has $S_o$ that is less than about $10^5$ cm/sec, preferably as much as a factor of 10 less or even smaller. For instance, $In_{0.53}Ga_{0.47}As$ has $S_o$ of about $10^3$ cm/sec. InP and InAs also meet the above inequality. In many cases it will be advantageous to use a non-alloyed metal contact, a degenerate semiconductor contact, or a combination of these, as a base contact, since this may result in a further increase in the minority carrier lifetime in the extrinsic base region if the contacts are formed such that the surface recombination on the extrinsic base region surface is not substantially increased above $S_o$ of the base material. Evaporation of the metal layer is believed to be a deposition method that will not substantially increase surface recombination, whereas sputtering is likely to result in an increase.

In FIG. 3 are shown exemplary results of (small signal) current gain vs. collector current, for three HBTs that were identical except for the width W of the emitter stripe. The transistors had an InP emitter (n-type, $5 \times 10^{17}$ cm$^{-3}$), a 65 nm thick p+($5 \times 10^{19}$) base, a 300 nm thick n−($1.5 \times 10^{16}$) collector depletion region and a 500 nm thick n+($5 \times 10^{19}$) collector contact region, with the last three regions being $In_{0.53}Ga_{0.47}As$. All three devices have a collector area of $9.6 \times 10^{-7}$ cm$^2$. As can be seen from the figure, the decrease in W results in a relatively minor decrease in the current gain, and the maximum (room temperature) small signal current gain of the transistor with smallest W is significantly greater than 100. Inventive devices will generally have room temperature $\beta \gtrsim 25$.

As will be appreciated by those skilled in the art, reduction in W without attendant significant decrease in $\beta$ can make possible increased large scale integration, not only because device size can be shrunk but, significantly, because power dissipation can be substantially lower, resulting in greatly reduced thermal load. Reduced emitter size of course can also result in smaller capacitance and thus potentially in higher cut-off frequency. Reduced recombination in the base also results in reduced power consumption.

We have discovered still other (optional) means that can result in improved performance in hot electron HBTs. A HBT typically operates by transforming a low impedance current source (the emitter current) into a high impedance current source (the collector current). In diffusive HBTs the scattering that takes place in the collector depletion region is a significant aspect of this impedance transformation. In inventive hot electron HBTs the current flow in the collector depletion region is substantially ballistic, and thus no impedance transformation takes place in the collector depletion region. Instead the transformation has to occur in the collector contact layer. This is achieved if the ballistic electrons that enter the contact region suffer (irreversible) scattering that thermalizes the electrons.

Most efficient scattering (and hence rapid impedance transformation) occurs if the plasma frequency of the contact region layer ($f_p$) satisfies $hf_p \gtrsim E_c$, where h is Planck's constant and $E_c$ is the average energy of the electrons arriving at the collector contact. Under normal operating conditions in a ballistic HBT $E_c \sim E_g$. Thus the condition can also be written as $hf_p \lesssim E_g$. As is well known, the plasma frequency is related to the carrier concentration n by $f_p = (ne^2/\pi \epsilon m^* m_o)^{\frac{1}{2}}$, where e is the electron charge, $\epsilon$ is the permittivity of the medium, and m* and $m_o$ are the effective mass and the bare mass of the carrier, respectively. This can be used to define an approximate upper limit on the dopant concentration in the collector contact region. It is $$n \lesssim (\pi \epsilon m^* m_o E_g^2)/e^2 h^2.$$

A lower doping limit for the collector contact can also be defined. Associated with the operation of a hot electron HBT according to the invention is an emitter/collector transit time $\tau_{ec}$, the average time an electron spends in transit between injection into the base and arrival at the collector contact layer. This time typically is very short, of order 0.1 ps (e.g., assuming a base layer thickness $Z_b$ of 30 nm and a collector depletion layer thickness of 70 nm, with an electron velocity of $10^8$ cm/sec). Associated with the collector contact region is a response time to the arrival of a hot electron that is the inverse of the plasma frequency. For efficient high frequency operation of the device it is desirable that this response time is much less (typically by at least about an order of magnitude) than $\tau_{ec}$). This condition, combined with the previously stated condition, defines a relatively narrow doping range for the collector contact layer, and especially preferred inventive devices meet these doping criteria, which can be written as $$(h/E_g) \lesssim (ne^2/\pi \epsilon m^* m_o)^{-\frac{1}{2}} << \tau_{ec}$$

Exemplarily, for a $In_{0.53}Ga_{0.47}As$ transit region of the above thickness this criterion teaches that the collector contact layer doping should be in the approximate range $10^{19}$–$2 \times 10^{20}$ cm$^{-3}$. Similar ranges are applicable for other potential collector materials.

We have also discovered that, at least under some operating conditions, a significantly improved $f_T$ can be achieved in HBTs which incorporate into the emitter one or more appropriately placed substantially undoped thin heteroepitaxial semiconductor layers (i.e., layers of a semiconductor other than the material of the bulk of the emitter), provided the material of the thin layers has the appropriate band structure.

The emitter charging time ($\tau_e$) of a HBT defines the highest frequency at which the device can be operated, and is given by $\tau_e = R_e C_e$, where $R_e$ and $C_e$ are the emitter resistance and capacitance, respectively. As is well known, in conventional HBTs an increase in the doping level of the emitter decreases $R_e$ but increases $C_e$ and thus is not very effective in reducing $\tau_e$.

We have found that incorporation of a relatively thin (exemplarily 1-10 nm, sufficient to prevent tunneling of holes from the base into the emitter under normal operating conditions) layer of semiconductor material of larger bandgap than the bulk of the emitter (with the offset being primarily in the valence band, with at most a small positive, preferably zero or negative, offset in the conduction band) into the emitter in close proximity to the base layer (e.g., 0-10 nm from the emitter/base interface) can result in improved majority carrier confinement in the base under high forward emitter junction bias.

We have also found that, to simultaneously achieve low $R_e$ and $C_e$, an additional thin (e.g., 1-10 nm, the thickness chosen to permit tunneling through the layer, resulting in the desired $R_e$) epitaxial layer of semiconductor material (also having a wider bandgap than the emitter bulk material but having a band line-up such that the offset is primarily in the conduction band) can be incorporated into the emitter, with the spacing between the two heteroepitaxial layers typically being somewhat larger than the layer thicknesses, e.g., 10-50 nm. The spacing typically is chosen to result in the desired relatively low value of $C_e$. The bulk material between the heteroepitaxial layers advantageously is relatively lightly doped (e.g., about $10^{16}$ cm$^{-3}$) to avoid space charging effects. Incorporation of the latter thin layer permits control of $C_e$ independently of $R_e$, whereby $\tau_e$ can be significantly reduced. It is anticipated that this approach can result in very fast (cut-off frequency significantly above 100 GHz) HBTs, especially if the device is operated at high current densities (e.g., emitter current density greater than about $10^4$ A/cm$^2$). At low current densities such devices however are likely to operate at somewhat lower speeds than optimized devices that do not have the additional layers in the emitter. Incorporation of these layers is optional and not a necessary feature of devices according to the invention.

Figure 4:
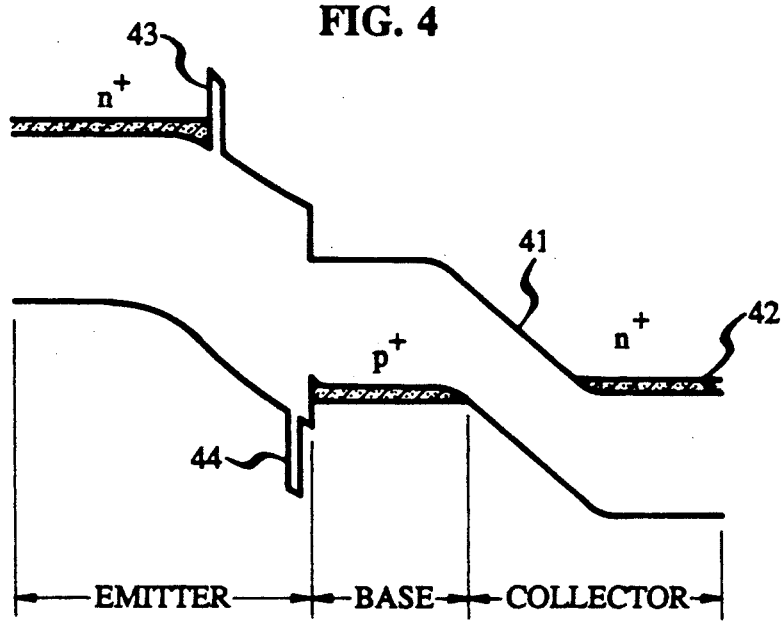
FIG. 4 schematically shows the relevant valance and conduction band edges in an exemplary device according to the invention.

FIG. 4 schematically depicts the band diagram of an exemplary HBT comprising heteroepitaxial layers in the emitter. Exemplarily the emitter comprises InP, with epitaxial layer 43 (exemplarily 5 nm thick) consisting of $In_{0.52}Al_{0.48}As$, and epitaxial layer 44 (exemplarily also 5 nm thick, 5 nm set back from the emitter/base interface, 25 nm spacing between 43 and 44) consisting of $In_{0.45}Al_{0.55}As$. The base and the collector contact 42 comprise heavily doped (p- and n-type, respectively) $In_{0.53}Ga_{0.47}As$, with the collector depletion region consisting of the same material but being lightly doped or undoped. The emitter contact region is heavily doped. As will be recognized by those skilled in the art, layers 43 and 44 are strained to control the valence band/conduction band offset, and the use of strained layers is currently thought to be an advantageous approach to the tailoring of the band structure of the material of the thin heteroepitaxial layers, and for tailoring of band-structure in general.

Figure 5:
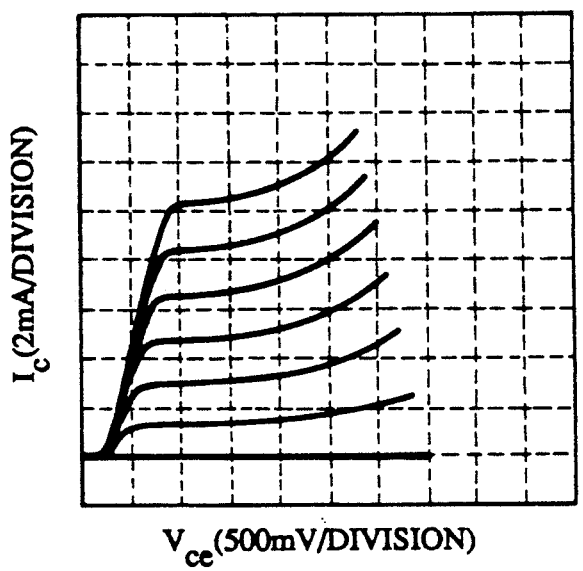
FIGS. 5 and 6 show the common emitter characteristics for two exemplary HBTs that differ in emitter size.

FIG. 5 shows standard common emitter characteristics ($I_c - V_{ce}$, $I_b$ increased in 10 $\mu$A steps) for an $In_{0.5}$-$_3Ga_{0.47}As$/InP hot electron HBT substantially as described in Example 1 below, with an emitter size of $30 \times 30$ $\mu m^2$. The characteristic shows that the transistor has a $\beta$ of about 200.

Figure 6:
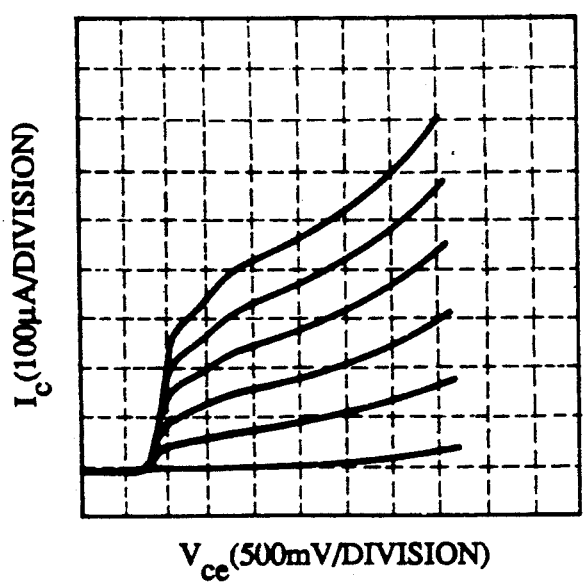

FIG. 6 shows similar characteristics for a hot electron HBT that differs from the transistor of FIG. 5 only in emitter size, with the former being $0.3 \times 3$ $\mu m^2$. The base current was increased in 1 $\mu$A steps. The curves show that the transistor has $\beta$ of about 100. Reduction in emitter size by a factor of $10^3$ thus resulted in a decrease in $\beta$ by only about a factor of 2, exemplifying lateral scaling, i.e., the relatively weak dependence of $\beta$ on collector width in HBTs according to the invention.

Figure 7:
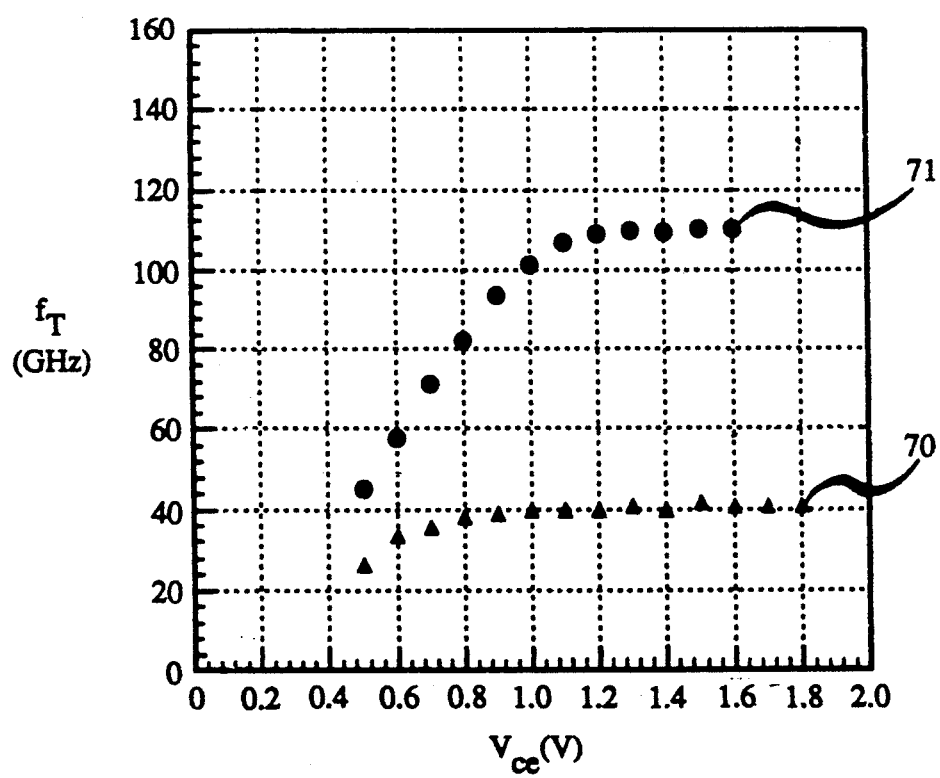
FIG. 7 shows $f_T$ vs. $V_{ce}$ of an exemplary HBT according to the invention.

FIG. 7 shows exemplary data on $f_T$ vs. $V_{ce}$ for an $In_{0.53}Ga_{0.47}As$/InP HBT substantially as described in Example 1. Curve 70 was obtained for $V_{be} = 0.8$ V, and curve 71 for $V_{be} = 0.9$ V. As can be seen, the device has large $f_T$ (exemplarily > 100 GHz) over a substantial range of $V_{bc}$, exemplarily between 0.1 and 0.7 volt. This characteristic of inventive HBTs is of considerable technological significance, as will be recognized by those skilled in the art.

EXAMPLE

Figure 8:
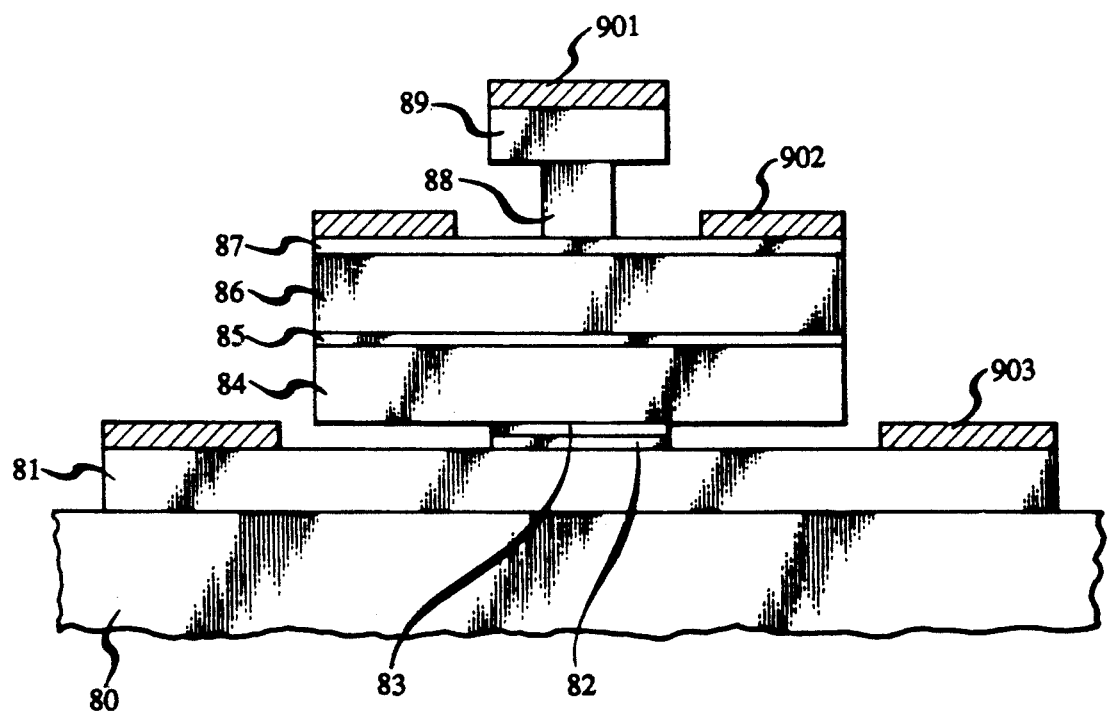
FIG. 8 schematically depicts an exemplary inventive HBT.

On a (100)-oriented semi-insulating InP wafer (80 of FIG. 8) was grown by gas source MBE the following sequence of epitaxial layers: a 250 nm InGaAs collector contact layer (n+, $3 \times 19^{19}$ cm$^{-3}$; 81 of FIG. 8); four etch stop layers (50 nm InP, 50 nm InGaAs, 300 nm InP, 50 nm InGaAs, respectively; all four layers n+, $3 \times 10^{19}$ cm$^{-3}$; 82, 83, 84, 85 of FIG. 8); 300 nm InGaAs collector depletion layer (n-, about $2.5 \times 10^{16}$ cm$^{-3}$; 86 of FIG. 8); 65 nm InGaAs base layer (about 50 nm being p+, $5 \times 10^{19}$ cm$^{-3}$, the remaining 15 nm grown with the dopant source closed; the base layer is 87 of FIG. 8); 300 nm InP emitter layer (n, $5 \times 10^{17}$; 88 of FIG. 8); and a 200 nm InGaAs emitter contact layer (n+, $7 \times 10^{19}$ cm$^{-3}$; 89 of FIG. 8). All layers referred to as InGaAs have composition $In_{0.53}Ga_{0.47}As$. The n-type dopant was Si, the base was doped with Be, and the emitter contact layer with Sn.

Onto the emitter contact layer was deposited a silicon nitride layer which was patterned by conventional means so as to define the emitter stripe geometry. The nitride stripe had dimensions $4 \times 4$ $\mu m^2$. The wafer was then etched in $1H_2SO_4:1H_2O_2:10H_2O$ at 0° C. until the emitter contact layer was removed except where it was protected by nitride, the remaining contact layer material being slightly etched back, forming an undercut. This was followed by an etch in 0° C. $3HCl:1H_2O$ which etched the InP emitter layer until it was also slightly undercut. Next the nitride was plasma removed and a photoresist layer applied and patterned to define the base mesa. The base mesa was etched in the 1:1:10 etch as described above, followed by an etch in the 3:1 etch that patterned the InP layer 86. This was followed by sequential etching of the etch stop layers substantially as described above. Next the patterned photoresist was removed and the collector contact layer patterned by standard lithography and etching in the 1:1:10 etch. The patterned resist was then removed. The above sequence of steps was carried out such that the resulting mesa had a geometry substantially as depicted schematically in FIG. 8, with some overlying layers overhanging an underlying layer.

A photoresist layer was then applied and patterned to define the emitter, base, and connector contacts, and 20 nm of Ti followed by 70 nm of Au evaporated onto the patterned resist layer. Lift-off of the unwanted metal left the self-aligned metal contacts (901, 902, 903 of FIG. 8) in place, with the contacts being spaced apart from the overlying layers, substantially as shown in FIG. 8. Next a 280 nm SiO$_2$ layer was deposited by a conventional (low temperature) technique, followed by patterning of the layer to open up windows to the underlying contacts. Finally, metal was deposited and patterned in a standard final metal lithography step. The last two layers are not shown in FIG. 8.

Among the thus produced HBTs was one approximately having a 0.3×3 μm$^2$ emitter stripe, a 6×11 μm$^2$ collector depletion region, and a 15×20 μm$^2$ collector contact region. For $V_{eb}$=0.9 V the transistor had $E_i$∼200 meV. With $V_{eb}$=0.9 V and $V_{bc}$=0.4 V the transistor had $f_T$ of 110 GHz and a DC current gain of 50.

The above described exemplary procedure results in a device that comprises regions (e.g., the emitter stripe and the collector depletion region) that are undercut in controlled fashion. We consider such undercutting to be a significant aspect of the invention since it permits self-aligned contact formation and generally is a contributing factor in the attainment of high speed, due to the resulting reduction in, e.g., collector capacitance.

We claim:

1. A heterostructure bipolar transistor comprising a collector region, a base region, and an emitter region, and further comprising means for making electrical contact with the emitter, base, and collector regions, respectively; the transistor being of the type wherein, under normal emitter/base forward bias conditions, hot electrons are injected into the base region from the emitter region; associated with the transistor being structural features including a width W of the emitter region, a base region thickness, a base region dopant concentration, and a base region surface that comprises, in addition to a portion that is overlain by the emitter region (this portion to be referred to as the "intrinsic" base region surface), a further portion that is adjacent to the emitter region and is not overlain by the emitter region, the further portion to be referred to as the "extrinsic" base region surface; wherein a) the emitter and collector regions comprise n-type III-V semiconductor material and the base region comprises p-type III-V semiconductor material;

b) the width W is at most 1 μm, the base region thickness is less than 100 nm, and at least a portion of the base region has a dopant concentration of at least 2×10$^{19}$/cm$^3$;

characterized in that c) the emitter region comprises at least a first and a second semiconductor material, associated with each of the first and second materials being a valence band edge and a conduction band edge, the second material having a bandgap that is wider than the bandgap of the first material, with the offset between the first and second material valence band edge being greater than half the difference between said bandgaps, a layer of the second material being epitaxial with the first material and being situated relatively close to the emitter region/base region interface and being substantially undoped, with the second material layer thickness selected to substantially prevent tunneling of holes from the base region into the emitter under normal emitter/base forward bias conditions.

2. A transistor according to claim 1, wherein the offset between the first and second material conduction band edge is zero or negative, and wherein said second material layer is a strained layer.

3. The transistor of claim 1, wherein said semiconductor material has approximate composition In$_{0.53}$Ga$_{0.47}$As.

4. The transistor of claim 1, wherein the second material layer has a thickness in the range 1–10 nm.

5. The transistor of claim 4, wherein the emitter region comprises a further relatively thin, undoped or unintentionally doped, layer of a third semiconductor material epitaxial with the first material, the third material also having a bandgap that is wider than the bandgap of the first material, the spacing between the two relatively thin layers being larger than the thickness of either of the layers, with one of the two layers being spaced a distance in the range 0–10 nm from the interface, the material between the two layers being lightly doped first material.

6. A transistor according to claim 1, the base region comprising semiconductor material having an intrinsic surface recombination velocity S$_o$, wherein the means for making electrical contact with the base region comprise a non-alloyed metal contact, a degenerate semiconductor contact or a combination of a non-alloyed metal contact and a degenerate semiconductor contact, the contacts formed such that the surface recombination velocity on the extrinsic base region surface is not substantially greater than S$_o$.

7. A transistor according to claim 1, wherein the means for making electrical contact with the base region comprise a non-alloyed metal contact, a degenerate semiconductor contact, or a combination of a non-alloyed metal contact and a degenerate semiconductor contact, wherein at least a portion of the collector region contains a dopant concentration greater than about 10$^{19}$ cm$^{-3}$.

8. In combination, a transistor according to claim 1, wherein the transistor is situated on a semiconductor substrate, with at least one other electronic or optoelectronic device also situated on or in the substrate, and with conductive means providing a conductive path between the transistor and the at least one other device.

* * * * *